(12) United States Patent
Nagoshi et al.

(10) Patent No.: US 9,235,121 B2
(45) Date of Patent: Jan. 12, 2016

(54) PHOTOSENSITIVE RESIN COMPOSITION, PHOTOSENSITIVE FILM, PERMANENT RESIST AND METHOD FOR PRODUCING PERMANENT RESIST

(75) Inventors: Toshimasa Nagoshi, Hitachi (JP); Shigeo Tanaka, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/237,618

(22) PCT Filed: Aug. 9, 2012

(86) PCT No.: PCT/JP2012/070369
§ 371 (c)(1),
(2), (4) Date: Feb. 7, 2014

(87) PCT Pub. No.: WO2013/022068
PCT Pub. Date: Feb. 14, 2013

(65) Prior Publication Data
US 2014/0154628 A1 Jun. 5, 2014

(30) Foreign Application Priority Data

Aug. 10, 2011 (JP) ............................... P2011-174885
Sep. 29, 2011 (JP) ............................... P2011-214755

(51) Int. Cl.
| | | |
|---|---|---|
| G03F 7/038 | (2006.01) | |
| G03F 7/004 | (2006.01) | |
| G03F 7/027 | (2006.01) | |
| H05K 3/28 | (2006.01) | |
| C08G 59/18 | (2006.01) | |
| C08L 63/00 | (2006.01) | |
| C08L 63/10 | (2006.01) | |

(52) U.S. Cl.
CPC ............ *G03F 7/0388* (2013.01); *C08G 59/186* (2013.01); *C08L 63/00* (2013.01); *C08L 63/10* (2013.01); *G03F 7/0047* (2013.01); *G03F 7/027* (2013.01); *G03F 7/038* (2013.01); *G03F 7/0385* (2013.01); *H05K 3/287* (2013.01); *H05K 2201/0209* (2013.01)

(58) Field of Classification Search
None
See application file for complete search history.

(56) References Cited

U.S. PATENT DOCUMENTS

| | | | | |
|---|---|---|---|---|
| 3,448,089 | A * | 6/1969 | Celeste ........................ | 525/286 |
| 5,009,982 | A * | 4/1991 | Kamayachi et al. ....... | 430/280.1 |
| 5,766,304 | A * | 6/1998 | Uenosono et al. ............. | 75/252 |
| 6,083,774 | A * | 7/2000 | Shiobara et al. ............. | 438/108 |
| 6,620,218 | B2 * | 9/2003 | Mårs et al. ...................... | 75/252 |
| 7,498,101 | B2 * | 3/2009 | Yamaguchi et al. .......... | 429/232 |
| 7,977,410 | B2 * | 7/2011 | Nagamatsu et al. .......... | 523/205 |
| 8,053,495 | B2 * | 11/2011 | Nishi et al. .................... | 523/220 |
| 8,063,120 | B2 * | 11/2011 | Nishi et al. .................... | 523/220 |
| 2002/0198286 | A1 * | 12/2002 | Igarashi et al. ............... | 523/137 |
| 2003/0116347 | A1 * | 6/2003 | Kubo et al. .................... | 174/260 |
| 2005/0250879 | A1 * | 11/2005 | Correll et al. ................ | 523/221 |
| 2011/0223539 | A1 * | 9/2011 | Kurafuchi et al. ......... | 430/280.1 |

FOREIGN PATENT DOCUMENTS

| | | | |
|---|---|---|---|
| EP | 0919873 | A1 * | 6/1999 |
| EP | 2154205 | A1 * | 2/2010 |
| JP | 59-070642 | A * | 4/1984 |
| JP | 61-243869 | | 10/1986 |
| JP | 2002-162738 | | 6/2002 |
| JP | 2008-285614 | A * | 11/2008 |
| JP | 2009-15309 | | 1/2009 |
| JP | 2010-280812 | | 12/2010 |
| JP | 2011-13622 | | 1/2011 |
| JP | 2011-48313 | | 3/2011 |
| JP | 2011-158628 | | 8/2011 |
| WO | WO-2010/026927 | A1 * | 3/2010 |
| WO | WO 2010/026927 | A1 | 3/2010 |

OTHER PUBLICATIONS

English translation of JP, 2008-285614, A (2008) from machine translation from AIPN Japan Patent Office National Center for Industrial Property Information and Training, generatedJan. 1, 2015, 13 pages.*
101;131273 English abstract from CAPLUS and CASREACT reactions for JP 59-070642 dated 1984 no month.*
English translation of JP, 201101322, A (2011) from machine translation from AIPN Japan Patent Office National Center for Industrial Property Information and Training, generated Jan. 1, 2015, 23 pages.*
Horiba Scientific, "A Guidebook to Particle Size Analysis", copyright 2014, Horiba Intrsuments, Inc, Irvine .CA, USA from www.horiba.com/us/particle obtained online 32 pages.*
"Microtrac" U.S. Appl. No. 85/407,047from Tradmark Electronic search systems, USPTO, downloaded Jul. 9, 2015, two pages.*
Notification of Transmittal of Translation of the International Preliminary Report on Patentability mailed Feb. 20, 2014, for International Application No. PCT/JP2012/070369.

* cited by examiner

*Primary Examiner* — Cynthia Hamilton
(74) *Attorney, Agent, or Firm* — Fitch, Even, Tabin & Flannery LLP (57) ABSTRACT

The present invention provides a photosensitive resin composition comprising an (a) component: an acid-modified epoxy resin, a (b) component: a photopolymerizable monomer having an ethylenically unsaturated group, a (c) component: a photopolymerization initiator, a (d) component: an epoxy resin, and an (e) component: an inorganic filler, wherein the (a) component comprises an acid-modified bisphenol novolak type epoxy resin and further the photosensitive resin composition satisfies a predetermined condition, and provides a photosensitive film, a permanent resist and a method for producing a permanent resist using the same.

15 Claims, 2 Drawing Sheets

Fig.1

Fig.2

PHOTOSENSITIVE RESIN COMPOSITION, PHOTOSENSITIVE FILM, PERMANENT RESIST AND METHOD FOR PRODUCING PERMANENT RESIST

TECHNICAL FIELD

The present invention relates to a photosensitive resin composition, a photosensitive film, a permanent resist, and a method for producing a permanent resist. Particularly, the present invention relates to a photosensitive resin composition suitable for producing a permanent resist to be used for a printed wiring board and a semiconductor package substrate.

BACKGROUND ART

With performance enhancement in various electronic apparatuses, high densification of a semiconductor package substrate in particular is progressing, and reliability higher than it has been in the past is required for a photosensitive solder resist to be used in an outermost layer (hereinafter also referred to as permanent resist). Specifically, the need for crack resistance is increasing as the substrate becomes highly multi-layered and the size of a chip becomes large, and the crack resistance higher than it has been in the past is required at the time of a temperature cycle test especially.

Moreover, enhancement in fineness of a wiring pitch is also progressing with the high densification, and electrical insulation resistance is required even in a wiring pitch having, for example, a line/space of 8 μm/8 μm or less. As an acceleration test for electrical insulation resistance, a highly accelerated temperature and humidity stress test (HAST) is usually carried out. The highly accelerated temperature and humidity stress test is an extremely severe test in which insulation resistance is evaluated under the environment of 130° C. and 85% RH while the predetermined voltage is applied to a comb-shaped electrode of 8 μm/8 μm.

In the past, as a solder resist for use in a semiconductor package substrate, for example, a photosensitive resin composition using an alkaline developable acid-modified epoxy resin obtained by adding acrylic acid to a cresol novolak type epoxy resin and thereafter modified with an acid anhydride (see, for example, Patent Literature 1) or a photosensitive resin composition further comprising an elastomer for the purpose of improving resistance to a TCT (Temperature Cycle Test) (see, for example, Patent Literature 2) has been used.

Moreover, in recent years, a photosensitive resin composition comprising a silica filler for the purpose of improving reflow resistance (see, for example, Patent Literature 3) or a photosensitive resin composition using a photopolymerizable compound having a particular structure for the purpose of improving HAST resistance (see, for example, Patent Literature 4) has been used.

CITATION LIST

Patent Literature

[Patent Literature 1] Japanese Patent Application Laid-Open No. 61-243869
[Patent Literature 2] Japanese Patent Application Laid-Open No. 2002-162738
[Patent Literature 3] Japanese Patent Application Laid-Open No. 2011-13622
[Patent Literature 4] Japanese Patent Application Laid-Open No. 2011-48313

SUMMARY OF INVENTION

Technical Problem

However, the conventional photosensitive resin compositions, in the application in which high reliability is required as describe above, have had room for improvement to satisfy, in particular, both of the crack resistance and the HAST resistance. Moreover, in order to satisfy the crack resistance of a solder resist to be used for a highly multi-layered substrate or a semiconductor package substrate of a large chip, a photosensitive resin composition having a low CTE (Coefficient of Thermal Expansion) and a high Tg (glass transition temperature) has been required, but the conventional photosensitive resin compositions have had room for improvement.

The present invention intends to provide an alkaline developable photosensitive resin composition that has a low CTE and a high Tg and is excellent in crack resistance in a highly multi-layered substrate and HAST resistance of an ultrafine pitch, and the present invention also intends to provide a photosensitive film, a permanent resist, and a method for producing a permanent resist using the same.

Solution to Problem

The first aspect of the present invention relates to a photosensitive resin composition comprising an (a) component: an acid-modified epoxy resin, a (b) component: a photopolymerizable monomer having an ethylenically unsaturated group, a (c) component: a photopolymerization initiator, a (d) component: an epoxy resin, and an (e) component: an inorganic filler, wherein the (a) component comprises an acid-modified bisphenol novolak type epoxy resin and further the photosensitive resin composition satisfies at least one of the conditions shown in the following (I) and (II).

(I) The (b) component comprises a photopolymerizable monomer having a tricyclodecane structure and a urethane bond; and
(II) The (e) component comprises a silica filler having a maximum particle size of 1 μm or less in an amount of more than 60 parts by mass based on a total of 100 parts by mass of the (a) component and the (b) component.

The photosensitive resin composition has a low CTE and a high Tg, is excellent in crack resistance in a highly multi-layered substrate and HAST resistance of an ultrafine pitch, and can be used as an alkaline developable solder resist excellent in resolution and gold plating resistance.

The detailed reason for which the effect of the present invention can be obtained is not clear, but it can be thought as follows for example. An acid-modified epoxy resin that has been used in the past has not been sufficient in terms of lowering CTE and crack resistance because of the structure thereof. Accordingly, it is thought that the rigidity and crosslinking density of the resin has been increased, the lowering of CTE has been able to be achieved and the crack resistance has been able to be improved by using an acid-modified bisphenol novolak type epoxy resin having both of a bisphenol part and a novolak part in the resin. Furthermore, it is inferred that the effect of the present invention has been exhibited by combining the acid-modified bisphenol novolak type epoxy resin and an optimum component.

In addition, the average particle size and the maximum particle size in the present description mean the average particle size and the maximum particle size that are measured by using a micro track method or a nano track method.

It is preferable that the acid-modified bisphenol novolak type epoxy resin comprises an acid modified bisphenol novolak type epoxy resin obtained by adding a polybasic acid anhydride to a product obtained by esterifying an epoxy resin having a structure represented by the following formula (1) with an ethylenically unsaturated group-containing monocarboxylic acid.

[Chemical Formula 1]

(1)

[In the formula (1), $R^1$ represents a hydrogen atom or a glycidyl group, $R^2$ represents a hydrogen atom or a methyl group, and n represents 1 or more; in addition, a plurality of $R^1$ and $R^2$ may be the same as or different each other.]

Moreover, it is preferable that the photopolymerizable monomer having a tricyclodecane structure and a urethane bond comprises a photopolymerizable monomer having a partial structure represented by the following formula (2) or the following formula (3). Thereby, the Tg and the HAST resistance can be further improved.

[Chemical Formula 2]

(2)

[Chemical Formula 3]

(3)

[In the formula (2) or the formula (3), $R^3$, $R^4$, $R^5$, and $R^6$ represent a direct bond, an alkylene group, or an arylene group.]

Moreover, it is preferable that the (b) component comprises a urethane compound obtained by reacting a diol compound having a tricyclodecane structure, a diisocyanate compound, and a compound having an ethylenically unsaturated group and a hydroxyl group.

Besides, it is preferable that the photosensitive resin composition further comprises a curing accelerator having an amino group in the molecule. Thereby, adhesiveness with a copper wiring can be further improved.

The second aspect of the present invention relates to a photosensitive film comprising a support and a photosensitive layer formed on the support, the photosensitive layer comprising the photosensitive resin composition.

The third aspect of the present invention relates to a method for producing a permanent resist comprising a step of forming a photosensitive layer comprising the photosensitive resin composition on a substrate, a step of irradiating the photosensitive layer with an active ray in a pattern, and a step of developing the photosensitive layer to form a permanent resist.

The fourth aspect of the present invention relates to a permanent resist comprising a cured product of the photosensitive resin composition. In addition, the permanent resist of the present invention can be obtained by curing the photosensitive resin composition of the present invention by light and/or heat. Therefore, in the cured product, some or all of the reactive groups in the photosensitive resin composition have disappeared because of reaction by the light and/or heat curing.

Advantageous Effects of Invention

According to the above aspects of the present invention, a photosensitive resin composition that is alkaline developable, has a low CTE and a high Tg, and achieves both of crack resistance in a highly multi-layered substrate and HAST resistance of an ultrafine pitch, and a photosensitive film, a permanent resist and a method for producing a permanent resist using the same can be provided.

DESCRIPTION OF EMBODIMENTS

Hereinafter, preferred embodiments of the present invention will be described in detail.

[Photosensitive Resin Composition]

A photosensitive resin composition of the present invention comprises an (a) component: an acid-modified epoxy resin, a (b) component: a photopolymerizable monomer having an ethylenically unsaturated group, a (c) component: a photopolymerization initiator, a (d) component: an epoxy resin, and an (e) component: an inorganic filler, wherein the (a) component comprises an acid-modified bisphenol novolak type epoxy resin and further the photosensitive resin composition satisfies at least one of the conditions shown in the following (I) and (II).

(I) The (b) component comprises a photopolymerizable monomer having a tricyclodecane structure and a urethane bond.

(II) The (e) component comprises a silica filler having a maximum particle size of 1 μm or less in an amount of more than 60 parts by mass based on a total of 100 parts by mass of the (a) component and the (b) component.

Hereinafter, respective components will be described in detail.

[(a) Component: Acid-modified Epoxy Resin]

The photosensitive resin composition of the present invention comprises an acid-modified epoxy resin as an (a) component. The acid-modified epoxy resin can be obtained, for example, by adding a polybasic acid anhydride (a3) to a product obtained by esterifying an epoxy resin (a1) with an ethylenically unsaturated group-containing monocarboxylic acid (a2).

The acid-modified epoxy resin can be obtained by the following two-step reaction. In the first reaction (hereinafter, referred to as "the first reaction" for convenience), an epoxy group of the epoxy resin (a1) reacts with a carboxyl group of the ethylenically unsaturated group-containing monocarboxylic acid (a2) to produce a hydroxyl group. In the next reaction (hereinafter referred to as "the second reaction" for convenience), it is inferred that the hydroxyl group produced by the first reaction and/or a hydroxyl group that the epoxy resin (a1) originally has react with an acid anhydride group of the polybasic acid anhydride (a3).

The epoxy resin (a1) is not particularly limited as long as the epoxy resin is a compound having one or two or more epoxy groups, and examples of the epoxy resin include novolak type epoxy resins, trisphenolmethane type epoxy resins, bisphenol A type epoxy resins, bisphenol F type epoxy resins, bisphenol S type epoxy resins, biphenyl type epoxy resins, and bisphenol novolak type epoxy resins.

Examples of the ethylenically unsaturated group-containing monocarboxylic acid (a2) include (meth)acrylic acid, crotonic acid, and cinnamic acid. Moreover, the ethylenically unsaturated group-containing monocarboxylic acid (a2) may be a half ester compound of a polybasic acid anhydride and a (meth)acrylate compound having a hydroxyl group or a half ester compound of a dibasic acid and an unsaturated monoglycidyl compound. The half ester compound means, for example, a compound in which only one of the two carboxyl groups of a compound having two carboxyl groups is esterified. Examples of the half ester reaction product include a reaction product obtained by reacting an anhydride of phthalic acid, tetrahydrophthalic acid, hexahydrophthalic acid, maleic acid, or succinic acid with hydroxyethyl (meth)acrylate, hydroxypropyl (meth)acrylate, tris(hydroxyethyl) isocyanulate di(meth)acrylate, or glycidyl (meth)acrylate in an equimolar ratio by the conventional method.

The ethylenically unsaturated group-containing monocarboxylic acid (a2) can be used alone or in combination of two or more kinds. Among the ethylenically unsaturated group-containing monocarboxylic acids (a2), (meth)acrylic acid is preferable. In addition, (meth)acryl means acryl or methacryl, and the same thing applies to other similar expressions such as (meth)acrylate.

Examples of the (meth)acrylate having a hydroxyl group include hydroxyethyl (meth)acrylate, hydroxypropyl (meth)acrylate, hydroxybutyl (meth)acrylate, polyethylene glycol mono(meth)acrylate, trimethylolpropane di(meth)acrylate, pentaerythritol (meth)acrylate, and dipentaerythritol hexa(meth)acrylate.

Examples of the polybasic acid anhydride (a3) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, itaconic anhydride, and trimellitic anhydride.

In the first reaction, it is preferable that the ratio of the ethylenically unsaturated group-containing monocarboxylic acid (a2) based on 1 equivalent of the epoxy group of the epoxy resin (a1) is 0.7 to 1.05 equivalent, more preferably 0.8 to 1.0 equivalent.

The epoxy resin (a1) and the ethylenically unsaturated group-containing monocarboxylic acid (a2) can be dissolved and reacted in an organic solvent. As an organic solvent, for example, ketones such as ethyl methyl ketone and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and carbitol acetate; aliphatic hydrocarbons such as octane and decane; and petroleum based solvents such as petroleum ether, petroleum naphtha, hydrogenated petroleum naphtha, and solvent naphtha can be used.

In the second reaction, it is inferred that the hydroxyl group produced in the first reaction and the hydroxyl group that is originally present in the epoxy compound (a1) are subjected to a half esterification reaction with the acid anhydride group in the polybasic acid anhydride (a3). Here, an equivalent of 0.1 to 1.0 of the polybasic acid anhydride (a3) based on 1 equivalent of the hydroxyl group in the resin obtained by the first reaction can be reacted. By adjusting the amount of the polybasic acid anhydride (a3) within the range, the acid value of the (a) component can be adjusted.

It is preferable that the acid value of the (a) component is 20 to 180 mg KOH/g, more preferably 30 to 150 mg KOH/g, particularly preferable 40 to 120 mg KOH/g, extremely preferable 50 to 90 mg KOH/g. Thereby, the developability of the photosensitive resin composition with an alkaline aqueous solution becomes favorable and excellent resolution becomes possible to be obtained. In addition, the measurement condition of the acid value in the present description is the same as in Examples.

Moreover, it is preferable that the weight average molecular weight of the (a) component is 2000 to 30000, more preferably 3000 to 20000, particularly preferably 5000 to 15000 from the standpoint of film coatability. The (a) component may be used in combination of two or more kinds of resins each having a different molecular weight. In addition, the measurement condition of the weight average molecular weight in the present description is the same as in Examples.

In addition, examples of the acid-modified epoxy resin include phenol novolak type acid-modified epoxy acrylates, bisphenol F type acid-modified epoxy acrylates, urethane-modified bisphenol A type acid-modified epoxy acrylates. A cresol novolak type acid-modified epoxy acrylate, a bisphenol F type acid-modified epoxy acrylate, and a urethane-modified bisphenol A type acid-modified epoxy acrylate are commercially available as, for example, EXP-2810 (manufactured by DIC Corporation), ZFR-1158 (manufactured by Nippon Kayaku Co., Ltd.) and UXE-3024 (manufactured by Nippon Kayaku Co., Ltd.), respectively.

The (a) component comprises an acid-modified bisphenol novolak type epoxy resin. The acid-modified bisphenol novolak type epoxy resin can be used without any particular limitation. The bisphenol structure in the acid-modified bisphenol novolak type epoxy resin may be a bisphenol A structure or a bisphenol F structure, but acid-modified bisphenol F novolak type epoxy resin is preferable from the standpoint of being excellent in crack resistance.

It is preferable to use an acid-modified bisphenol novolak type epoxy resin obtained by adding a polybasic acid anhydride (a3) to a product obtained by esterifying an epoxy resin having a structure represented by the following formula (1)

with an ethylenically unsaturated group-containing monocarboxylic acid (a2) as the acid-modified bisphenol novolak type epoxy resin.

[Chemical Formula 4]

(1)

[In the formula (1), $R^1$ represents a hydrogen atom or a glycidyl group, $R^2$ represents a hydrogen atom or a methyl group, and n represents 1 or more; in addition, a plurality of $R^1$ and $R^2$ may be the same as or different from each other.]

The n represents an integer number for a single molecule and a rational number that is an average value for an assembly of multiple kinds of molecules.

Commercially available products can be used as the acid-modified bisphenol novolak type epoxy resin. Examples of the commercially available products include EXP-3133 and EXP-3135 (both manufactured by DIC Corporation) which are bisphenol F novolak type acid-modified epoxy resin, and EXP-2827 (manufactured by DIC Corporation).

[(b) Component: Photopolymerizable Monomer Having Ethylenically Unsaturated Group]

The photosensitive resin composition of the present invention comprises a photopolymerizable monomer having an ethylenically unsaturated group. Among the photopolymerizable monomers having an ethylenically unsaturated group, it is preferable that the photosensitive resin composition of the present invention comprises a photopolymerizable monomer having a tricyclodecane structure and a urethane bond from the standpoint of being excellent in HAST resistance. In this case, it is preferable that the photosensitive resin composition of the present invention comprises a photopolymerizable monomer having a partial structure represented by the following formula (2) or the following formula (3). In addition, the tricyclodecane structure includes, for example, a structure represented by the following formula (4).

[Chemical Formula 5]

(2)

[Chemical Formula 6]

(3)

[In the formula (2) or the formula (3), $R^3$, $R^4$, $R^5$, and $R^6$ represent a direct bond, an alkylene group, or an arylene group.]

[Chemical Formula 7]

(4)

It is preferable that the alkylene group is an alkylene group having 2 to 20 carbon atoms, more preferably an alkylene group having 2 to 10 carbon atoms, further more preferably an alkylene group having 2 to 6 carbon atoms.

Examples of the alkylene group having 2 to 6 carbon atoms include an ethylene group, a propylene group, an isopropylene group, a butylene group, a pentylene group, a hexylene group, but it is preferable that the alkylene group having 2 to 6 carbon atoms is the ethylene group or the isopropylene group, more preferably the ethylene group from the standpoint of resolution and plating resistance.

It is preferable that the arylene group is an arylene group having 6 to 14 carbon atoms, more preferably an arylene group having 6 to 10 carbon atoms. Examples of such an arylene group include phenylene and naphthylene.

It is preferable that the photopolymerizable monomer having a tricyclodecane structure and a urethane bond is a urethane compound obtained by reacting a (b1) diol compound having a tricyclodecane structure, a (b2) diisocyanate compound, and a (b3) compound having an ethylenically unsaturated group and a hydroxyl group.

An example of the (b1) diol compound having a tricyclodecane structure includes tricyclodecane dimethanol.

The (b2) diisocyanate compound is not particularly limited, but a compound having a ring structure is preferable. Among the diisocyanate compounds having a ring structure, a compound having a rigid structure such as isophorone diisocyanate is more preferable from the standpoint of crack resistance (heat resistance).

Moreover, among the (b3) compounds having an ethylenically unsaturated group and a hydroxyl group, the compound having two ethylenically unsaturated groups is preferable, and the compound having three ethylenically unsaturated groups is more preferable from the standpoint of crosslink density. An example of the compound having three ethylenically unsaturated groups in the molecule includes a compound represented by the following formula (5).

[Chemical Formula 8]

(5)

[In the formula (5), a plurality of $R^7$ and $R^8$ may be the same as or different from each other, $R^7$ represents an alkylene group having 1 to 10 carbon atoms or an arylene group having 6 to 14 carbon atoms, $R^8$ represents a hydrogen atom, an alkyl group having 1 to 10 carbon atoms, or an aryl group having 6 to 14 carbon atoms, and l, m, and n represent 1 to 10.]

In the above formula (5), l, m, and n represent a number of constitutional units. Therefore, l, m, and n represent an integer number for a single molecule and a rational number that is an average value for an assembly of multiple kinds of molecules.

The photopolymerizable monomer having a tricyclodecane structure and a urethane bond, among the above compounds, is more preferable in the case where the (b2) diisocyanate is isophorone diisocyanate and the compound having an ethylenically unsaturated group and a hydroxyl group is the compound represented by the above formula (5). As such compounds, UX-5002D-M20, UX-5002D-P20 (manufactured by Nippon Kayaku Co., Ltd.), and so on are commercially available.

Moreover, it is preferable that the content of the (b) component is 10 parts by mass to 60 parts by mass, more preferably 15 parts by mass to 50 parts by mass, based on a total of 100 parts by mass of the (a) component and the (b) component. When the content of the (b) component is less than 10 parts by mass, the effect of enhancing HAST resistance becomes small, and when the content of the (b) component exceeds 60 parts by mass, a development residue tends to occur. In addition, when the photosensitive resin composition comprises two or more kinds of the (a) components, it is also preferable that the content of the (b) component is 10 parts by mass to 60 parts by mass based on a total of 100 parts by mass of the acid-modified epoxy resin.

In addition, the photosensitive resin composition may further contain another photopolymerizable monomer without particular limitation, but it is preferable that the photosensitive resin composition comprises a photopolymerizable monomer having three or more ethylenically unsaturated groups.

Examples of the photopolymerizable monomer having three or more ethylenically unsaturated groups include a compound obtained by reacting a polyhydric alcohol such as trimethylolpropane tri(meth)acrylate, tetramethylolmethane tri(meth)acrylate, tetramethylolmethane tetra(meth)acrylate, dipentaerythritol penta(meth)acrylate, and dipentaerythritol hexa(meth)acrylate with an α,β-unsaturated carboxylic acid; and a compound obtained by adding an α,β-unsaturated carboxylic acid to a glycidyl group-containing compound such as trimethylolpropane triglycidyl ether triacrylate.

Among the above compounds, it is preferable that the photosensitive resin composition comprises at least one selected from a (meth)acrylate compound having a skeleton originated from pentaerythritol, a (meth)acrylate compound having a skeleton originated from dipentaerythritol, and a (meth)acrylate compound having a skeleton originated from trimethylolpropane, more preferably comprises at least one selected from a (meth)acrylate compound having a skeleton originated from dipentaerythritol and a (meth)acrylic compound having a skeleton originated from trimethylolpropane, and further more preferably comprises a (meth)acrylate compound having a skeleton originated from dipentaerythritol from the standpoint of further improving crack resistance at the time of reflow mounting.

Here, the (meth)acrylate having a skeleton originated from dipentaerythritol means a product obtained by esterifying dipentaerythritol with (meth)acrylic acid, and a compound modified with an alkyleneoxy group is also included in the product. It is preferable that the number of ester bonds in one molecule in the product is 6, but a compound having a number of ester bonds of 1 to 5 may be mixed.

The (meth)acrylate compounds having a skeleton originated from dipentaerythritol are commercially available as KAYARAD DPHA, KAYARAD D-310, KAYARAD D-330, KAYARAD DPCA-20 and -30, and KAYARAD DPCA-60 and -120 (all manufactured by Nippon Kayaku Co., Ltd.).

Moreover, it is preferable that the photosensitive resin composition comprises a photopolymerizable monomer having two ethylenically unsaturated groups.

Examples of the photopolymerizable monomer having two ethylenically unsaturated groups include a compound obtained by reacting a bisphenol A based (meth)acrylate compound, dimethylol tricyclodecane di(meth)acrylate, tricyclodecanediol di(meth)acrylate, or a glycidyl group-containing compound with an α,β-unsaturated carboxylic acid; and a urethane di(meth)acrylate compound. These compounds can be used alone or in combination of two or more kinds.

Among the above compounds, it is preferable that the photosensitive resin composition comprises dimethylol tricyclodecane di(meth)acrylate or tricyclodecanediol di(meth)acrylate from the standpoint of improving heat resistance of a cured film. Tricyclodecanediol dimethacrylate is commercially available as NK Ester DCP (manufactured by Shin-Nakamura Chemical Co., Ltd.), and tricyclodecane dimethanol diacrylate is commercially available as NK Ester A-DCP (manufactured by Shin-Nakamura Chemical Co., Ltd.).

Moreover, among the above compounds, it is preferable that the photosensitive resin composition comprises a bisphenol A based (meth)acrylate compound from the standpoint of being excellent in resolution. Among the bisphenol A based (meth)acrylate compounds, 2,2-bis(4-(methacryloxy pentaethoxy)phenyl)propane is commercially available as FA-321M (manufactured by Hitachi Chemical Co., Ltd.) or BPE-500 (manufactured by Shin-Nakamura Chemical Co., Ltd.), and 2,2-bis(4-(methacryloxy pentadecaethoxy)phenyl) is available as, for example, BPE-1300 (manufactured by Shin-Nakamura Chemical Co., Ltd.).

[(c) Component: Photopolymerization Initiator]

The photosensitive resin composition of the present invention comprises a photopolymerization initiator. A known photopolymerization initiator can be used as a photopolymerization initiator without particular limitation as long as the photopolymerization initiator is adjusted to the light wavelength of the exposure machine to be used. Specific examples include an aromatic ketones such as benzophenone, N,N'-tetraalkyl-4,4'-diaminobenzophenones, 2-benzyl-2-dimethylamino-1-(4-morpholinophenyl)-butanone-1,2-methyl-1-[4-(methylthio)phenyl]-2-morpholino-propanone-1,4,4'-bis (dimethylamino)benzophenone (Michler's ketone), 4,4'-bis (diethylamino)benzophenone, and 4-methoxy-4'- dimethylaminobenzophenone; quinones such as alkyl anthraquinones and phenanthrenequinone; benzoin compounds such as benzoin and alkyl benzoins; benzoin ether compounds such as benzoin alkyl ethers and benzoin phenyl ethers; benzyl derivatives such as benzyl dimethyl ketal; 2,4,5-triaryl imidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2,4-di(p-methoxyphenyl)-5-phenylimidazole dimer, and 2-(2,4-dimethoxyphenyl)-4,5-diphenylimidazole dimer; N-phenyl glycine and N-phenyl glycine derivatives; acridine derivatives such as 9-phenyl acridine and 1,7-bis(9,9'-acridinyl)heptane; oxime esters such as 1,2-octanedione,1-[4-(phenylthio)-,2-(O-benzoyloxime)], and ethanone,1-[9-ethyl-6-(2-methylbenzoyl)-9H-carbazole-3-yl]-,1-(O-acetyloxime); coumarin based compounds such as 7-dimethylamino-4-methylcoumarin; thioxanthone based compounds such as 2,4-diethyl thioxanthone; and acylphosphine oxide based compounds such as 2,4,6-trimethylbenzoyl-diphenyl-phosphine oxide. These compounds can be used alone or in combination of two or more kinds.

Among the above compounds, it is preferable to use the aromatic ketone, the oxime ester compound, the thioxanthone compound or the acylphosphine oxide compound, more preferably to use the aromatic ketone or the thioxanthone compound, and further more preferably to use the aromatic ketone and the thioxanthone compound simultaneously from the standpoint of obtaining resolution and a rectangular pattern shape.

As the aromatic ketone, 2-methyl-1-[4-(methylthio)phenyl]-2-morpholino-propanone-1 is the most preferable. 2-methyl-1-[4-(methylthio)phenyl]-2-morpholino-propanone-1 is commercially available as IRGACURE 907 (manufactured by BASF Corporation).

Examples of the compound having an oxime ester include (2-(acetyloxyiminomethyl)thioxanthene-9-one), (1,2-octanedione,1-[4-(phenylthio)-,2-(O-benzoyloxime)], (ethanone,1-[9-ethyl-6-(2-methylbenzoyl)-9H-carbazole-3-yl]-, 1-(O-acetyloxime)). Among the above compounds, (ethanone,1-[9-ethyl-6-(2-methylbenzoyl)-9H-carbazole-3-yl]-,1-(O-acetyloxime)) is the most preferable. This is commercially available as IRGACURE-OXE02 (manufactured by BASF Corporation).

As the thioxanthone compound, 2,4-diethylthioxanthone is the most preferable. It is commercially available as KAYACURE-DETX-S (manufactured by Nippon Kayaku Co., Ltd.).

As the acylphosphine oxide compound, 2,4,6-trimethylbenzoyl-diphenyl-phosphine oxide is the most preferable. It is commercially available as LUCIRIN-TPO (manufactured by BASF Corporation).

It is preferable to use a phosphine oxide based photopolymerization initiator from the standpoint of making a resist shape more favorable. Examples of such a compound include monoacylphosphine oxides such as 2,4,6-trimethylbenzoyl-diphenyl-phosphine oxide, bisacylphosphine oxides such as bis(2,4,6-trimethylbenzoyl)-phenylphosphine oxide and bis (2,6-dimethoxybenzoyl)-2,4,4-trimethyl-pentylphosphine oxide. 2,4,6-trimethylbenzoyl-diphenyl-phosphine oxide and bis(2,4,6-trimethylbenzoyl)-phenylphosphine oxide are commercially available as, for example, DAROCURE-TPO (manufactured by Ciba Japan K. K.) and, for example, IRGACURE-819 (manufactured by Ciba Japan K. K.), respectively.

Moreover, it is preferable the photosensitive resin composition of the present invention further comprises a compound having an acridine ring or a compound having an oxime ester for the purpose of improving sensitivity, and these compounds can be used simultaneously.

Examples of the compound having an acridine ring include 9-phenylacridine, 9-aminoacridine, 9-pentylaminoacridine, bis(9-acridinyl)alkanes such as 1,2-bis(9-acridinyl)ethane, 1,3-bis(9-acridinyl)propane, 1,4-bis(9-acridinyl)butane, 1,5-bis(9-acridinyl)pentane, 1,6-bis(9-acridinyl)hexane, 1,7-bis (9-acridinyl)heptane, 1,8-bis(9-acridinyl)octane, 1,9-bis(9-acridinyl)nonane, 1,10-bis(9-acridinyl)decane, 1,11-bis(9-acridinyl)undecane, and 1,12-bis(9-acridinyl)dodecane, 9-phenylacridine, 9-pyridylacridine, 9-pyrazinylacridine, 9-monopentylaminoacridine, 1,3-bis(9-acridinyl)-2-oxapropane, 1,3-bis(9-acridinyl)-2-thiapropane, 1,5-bis(9-acridinyl)-3-thiapentane, and, among these compounds, 1,7-bis(9-acridinyl)heptane is more preferable. 1,7-bis(9-acridinyl)heptane is commercially available as, for example, N-1717 (manufactured by ADEKA Corporation).

It is preferable that the content of the (c) component is 0.1 parts by mass to 10 parts by mass, more preferably 0.5 parts by mass to 7 parts by mass based on a total of 100 parts by mass of the (a) component and the (b) component.

It is preferable that the content of the aromatic ketone is 0.1 parts by mass to 5 parts by mass, more preferably 0.5 parts by mass to 5 parts by mass, further more preferably 1.0 parts by mass to 5 parts by mass, based on a total of 100 parts by mass of the (a) component and the (b) component.

It is preferable that the content of the thioxanthone compound is 0.01 parts by mass to 1 parts by mass, more preferably 0.05 parts by mass to 0.5 parts by mass, further more preferably 0.1 parts by mass to 0.3 parts by mass, based on a total of 100 parts by mass of the (a) component and the (b) component.

[(d) Component: Epoxy Resin]

The photosensitive resin composition of the present invention comprises an epoxy resin (except the above-described acid-modified epoxy resin). Examples of the (d) component include bisphenol A type epoxy resins such as bisphenol A diglycidyl ethers, bisphenol F type epoxy resins such as bisphenol F diglycidyl ethers, bisphenol S type epoxy resins such as bisphenol S diglycidyl ethers, bisphenol type epoxy resins such as bisphenol diglycidyl ethers, bixylenol type epoxy resins such as bixylenol diglycidyl ethers, hydrogenated bisphenol A type epoxy resins such as hydrogenated bisphenol A glycidyl ethers, phenolbiphenylaralkyl type epoxy resins, and bisphenol novolak type epoxy resins. These compounds are used alone or in combination of two or more kinds.

As the above compounds, commercially available products can be used. Examples of the bisphenol A diglycidyl ethers include EPIKOTE 828, EPIKOTE 1001, and EPIKOTE 1002 (all manufactured by Japan Epoxy Resin Co., Ltd.). Examples of bisphenol F diglycidyl ethers include EPIKOTE 807 (manufactured by Japan Epoxy Resin Co., Ltd.) and YSLV-80 (manufactured by Nippon Steel Chemical Co., Ltd.), and examples of bisphenol S diglycidyl ethers include EBPS-200 (manufactured by Nippon Kayaku Co., Ltd.) and EPICLON EXA-1514 (manufactured by Dainippon Ink and Chemicals, Inc.) Moreover, examples of the bisphenol diglycidyl ethers include YL6121 (manufactured by Japan Epoxy Resin Co., Ltd.), and examples of bixylenol diglycidyl ethers include YX4000H (manufactured by Japan Epoxy Resin Co., Ltd.). Furthermore, examples of hydrogenated bisphenol A glycidyl ethers include ST-2004 and ST-2007 (both manufactured by Tohto Kasei Co., Ltd.), and examples of phenol biphenyl aralkyl type epoxy resins include NC-3000H (Nippon Kayaku Co., Ltd). These compounds are used alone or in combination of two or more kinds.

Among the above compounds, it is preferable that the photosensitive resin composition of the present invention comprises a bisphenol F type epoxy resin, a phenol biphenyl aralkyl type epoxy resin, or a bisphenol novolak type epoxy resin from the standpoint of crack resistance.

The bisphenol F type epoxy resin includes YSLV-80 (manufactured by Nippon Steel Chemical Co., Ltd.). Moreover, the phenol biphenyl aralkyl type epoxy resin includes NC-3000H (Nippon Kayaku Co., Ltd.). Furthermore, EXA-7372 (bisphenol F type novolak type epoxy resin, manufactured by DIC Corporation) and 157S70 (bisphenol A type novolak type multifunctional epoxy resin, manufactured by Mitsubishi Chemical Corporation) are commercially available as the bisphenol novolak type epoxy resin. These compounds are used alone or in combination of two or more kinds.

It is preferable that the content of the (d) component is 5 parts by mass to 50 parts by mass, more preferably 10 parts by mass to 40 parts by mass, further more preferably 15 parts by mass to 40 parts by mass, particularly preferably 20 parts by mass to 35 parts by mass, based on a total of 100 parts by mass of the (a) component and the (b) component.

[(e) Component: Inorganic Filler]

The photosensitive resin composition of the present invention comprises an inorganic filler. As the (e) component, barium sulfate, barium titanate, a powdered silicon oxide, amorphous silica, talc, clay, fired kaolin, magnesium carbonate, calcium carbonate, aluminum oxide, aluminum hydroxide, and mica powder for example can be used. Among the above compounds, it is preferable that the photosensitive resin composition of the present invention comprises a silica filler from the standpoint of lowering CTE.

It is preferable to use a silica filler that is dispersible in the photosensitive resin composition so that the maximum particle size is 1 μm or less from the standpoint of satisfying HAST resistance of an ultrafine pitch, reducing CTE, and enhancing resolution and gold plating resistance.

Moreover, it is preferable that the inorganic filler is dispersed in the photosensitive resin composition so that the maximum particle size is 1 μm or less, furthermore it is preferable that the average particle size of the inorganic filler is 3 to 300 nm, more preferably 5 to 300 nm.

As the kind of the silica filler, any of fused spherical silica, fused pulverized silica, crystalline silica, fumed silica, sol-gel silica, and the like can be used. Fused spherical silica, fumed silica, sol-gel silica, and the like are preferable, and among them, fumed silica and sol-gel silica are more preferable from the standpoint of the particle size. The silica is dispersed in the resin while the primary particle size is maintained without aggregation and used. At the time of use, a silane coupling treatment may be carried out on the surface of the silica.

Commercially available silane coupling agents can be used as the silane coupling agent. For example, alkyl silanes, alkoxy silanes, vinyl silanes, epoxy silanes, amino silanes, acryl silanes, methacryl silanes, mercapto silanes, sulfide silanes, isocyanate silanes, sulfur silanes, styryl silanes, and alkyl chlorosilanes are usable.

Examples of the silane coupling agents include methyltrimethoxy silane, dimethyldimethoxy silane, trimethylmethoxy silane, methyltriethoxy silane, methyltriphenoxy silane, ethyltrimethoxy silane, n-propyltrimethoxy silane, diisopropyldimethoxy silane, isobutyltrimethoxy silane, diisobutyldimethoxy silane, isobutyltriethoxy silane, n-hexyltrimethoxy silane, n-hexyltriethoxy silane, cyclohexylmethyldimethoxy silane, n-octyltriethoxy silane, n-dodecylmethoxy silane, phenyltrimethoxy silane, diphenyldimethoxy silane, triphenyl silanol, methyltrichlorosilane, dimethyldichlorosilane, trimethylchlorosilane, n-octyldimethylchlorosilane, tetraethoxy silane, 3-aminopropyltrimethoxy silane, 3-aminopropyltriethoxy silane, 3-(2-aminoethyl)aminopropyltrimethoxy silane, 3-(2-aminoethyl)aminopropylmethyldimethoxy silane, 3-phenylaminopropyltrimethoxy silane, 3-glycidoxypropyltrimethoxy silane, 3-glycidoxypropylmethyldimethoxy silane, 3-glycidoxypropyltriethoxy silane, 3glycidoxypropylmethyldimethoxy silane, bis(3-(triethoxysilyl)propyl)disulfide, bis(3-(triethoxysilyl)propyl)tetrasulfide, vinyltriacetoxy silane, vinyltrimethoxy silane, vinyltriethoxy silane, vinyl triisopropoxy silane, allyltrimethoxy silane, diallyldimethyl silane, 3-methacryloxypropyltrimethoxy silane, 3-methacryloxypropylmethyldimethoxy silane, 3-methacryloxypropyltriethoxy silane, 3-mercaptopropyltrimethoxy silane, 3-mercaptopropylmethyldimethoxy silane, 3-mercaptopropyltriethoxy silane, N-(1,3-dimethylbutylidene)-3-aminopropyltriethoxy silane, and amino silane.

It is preferable that the (e) component comprises barium sulfate together with the silica. By using both of the silica and the barium sulfate, desired particle size distribution can be easily imparted, and hardness of the photosensitive resin composition can be adjusted.

It is preferable that the content of the (e) component is 1 to 100 parts by mass, more preferably 5 to 80 parts by mass, further more preferably 10 to 50 parts by mass, based on a total of 100 parts by mass of the (a) component and the (b) component.

It is preferable that the content of the silica filler is 10 to 500 parts by mass, more preferably 20 to 400 parts by mass, further more preferably 50 to 300 parts by mass, particularly preferably more than 60 parts by mass, based on a total of 100 parts by mass of the (a) component and the (b) component.

In addition, it is preferable the photosensitive resin composition of the present invention further comprises a polymerization inhibitor in addition to the above-described (a) to (e) components. The polymerization inhibitor includes hydroquinones, hydroquinone monomethyl ethers, tert-butylcatechol, pyrogallol, and phenothiazine. It is more preferable that the polymerization inhibitor is a phenol based antioxidizing agent.

It is preferable that the melting point of the polymerization inhibitor is 100° C. or more, more preferably 125° C. or more from the standpoint of suppressing volatilization at the time of heating after the completion of a development step.

Moreover, it is preferable that the weight average molecular weight of the polymerization inhibitor is 300 or more, more preferably 370 or more from the standpoint of being excellent in antioxidation.

Moreover, it is preferable that the photosensitive resin composition further comprises a compound having an amino group in the molecule as a curing accelerator in addition to the above-described (a) to (e) components from the standpoint of achieving chemical resistance and plating resistance at a higher level. The present curing accelerator can achieve the chemical resistance and the plating resistance in the case of a thin film at a higher level.

Examples of the curing accelerator having an amino group in the molecule include dicyanediamides, melamines, guanamines, and derivatives thereof, and specifically dicyanediamide, melamine, acetoguanamine, benzoguanamine, melamine-phenol-formalin, commercial products manufactured by Shikoku Chemicals Corporation: 2MZ-AZINE, 2E4MZ-AZINE, C11Z-AZINE, 2MA-OK. Among the above compounds, it is preferable that the photosensitive resin composition contains a melamine compound.

Besides, additives such as triazine compounds and derivatives thereof, imidazole based additives, thiazole based additives, triazole based additives, and silane coupling agents can be used. Specific examples include triazine derivatives such as ethyldiamino-S-triazine, 2,4-diamino-S-triazine, 2,4-diamino-6-xylyl-S-triazine.

In the case where the photosensitive resin composition comprises the curing accelerator, it is preferable that the content of the curing accelerator is 0.1 parts by mass to 5 parts by mass, more preferably 0.5 parts by mass to 5 parts by mass, further more preferably 1.0 parts by mass to 5 parts by mass, based on a total of 100 parts by mass of the (a) component and the (b) component.

Besides, the photosensitive resin composition can use a pigment component of respective colors as required. As a pigment component, colorants or dyes such as phthalocyanine blue, phthalocyanine green, iodine green, disazo yellow, malachite green, crystal violet, titanium oxide, carbon black, naphthalene black, and azo based organic pigments may be used.

The photosensitive resin composition may further comprise thixotropy-imparting agents such as benton, montmorillonite, aerosil, and amide waxes, antifoaming agents such as silicone based, fluorine based, and polymer based antifoaming agents, and leveling agents within the range that does not affect the desired properties of the photosensitive resin composition.

The photosensitive resin composition of the present invention includes a form prepared by mixing the above-described respective components into a solvent. As the solvent, alcohols, glycol ethers, ethylene glycol alkyl ether acetates, esters, or diethylene glycol can be used from the standpoints of dissolvability and easiness of coating film formation of each component.

Among the above solvents, it is preferable to use ethylene glycol monobutyl ether acetate, diethylene glycol monoethyl ether acetate, diethylene glycol diethyl ether, diethylene glycol ethyl methyl ether, diethylene glycol dimethyl ether, propylene glycol monomethyl ether, and propylene glycol monomethyl ether acetate.

In addition, in the case where the photosensitive resin composition to be used in the present invention comprises a solvent, it is preferable that the content of the solvent is 5 to 40 mass % based on the total amount of the photosensitive resin composition.

[Photosensitive Film]

Next, a photosensitive film of a preferred embodiment will be described. The photosensitive film according to the present embodiment is a photosensitive film comprising a support and a photosensitive layer formed on the support, the photosensitive layer comprising the photosensitive resin composition. The photosensitive layer is also referred to as a photosensitive resin composition layer. In addition, the photosensitive layer may further comprise a protective film covering the photosensitive layer thereon.

As the support, polymer films having heat resistance and solvent resistance such as, for example, polyesters such as polyethylene terephthalates; polypropylenes; and polyethylenes. It is preferable to make the thickness of the support (polymer film) 5 to 25 µm. When the thickness of the support is less than 5 µm, the support film tends to be broken during peeling the support film before developing, and when the thickness of the support exceeds 25 resolution tends to be lowered. In addition, the polymer film may be used in such a way that the polymer films are laminated on both sides of the photosensitive layer as a support and protective film.

As the protective film, polymer films having heat resistance and solvent resistance such as, for example, polyesters such as polyethylene terephthalates; polypropylenes; and polyethylenes. Examples of the commercial products include, but not limited to, polypropylene films such as product names "ALPHAN MA-410" and "E-200C", manufactured by Oji Paper Co., Ltd. and Shin-Etsu Film Co., Ltd., respectively and polyethylene terephthalate films such as product name "PS-25" and the like of PS series manufactured by Teijin Ltd.

It is preferable that the thickness of the protective film is 1 to 100 µm, more preferably 5 to 50 µm, further more preferably 5 to 30 µm, particularly preferably 15 to 30 µm. When the thickness is less than 1 µm, the protective film tends to be broken during laminating, and when the thickness exceeds 100 µm, the protective film tends to be inferior in inexpensiveness. In addition, the protective film in which adhesive force between the photosensitive layer and protective film is smaller than the adhesive force between the photosensitive layer and the support is preferable and moreover the film that is low in fish-eye is preferable. A fish-eye means a foreign substance, an undissolved substance, an oxidation-degraded substance, or the like of a material which are taken in a film in producing the film by a kneading method, an extrusion method, a biaxial stretching method, or a casting method etc., after melting the material thermally.

It is preferable that the photosensitive layer is formed by dissolving the photosensitive resin composition in the above-described solvent (solvent) to make a solution having a solid content of about 30 to about 70 mass % (coating liquid), thereafter coating the solution (coating liquid) on the support, and drying. The coating can be carried out by a known method using, for example, a roll coater, a comma coater, a gravure coater, an air knife coater, a die coater, a bar coater, or the like. Moreover, the drying can be carried out at 70 to 150° C. for about 5 to about 30 minutes. It is preferable that the amount of residual organic solvent in the photosensitive resin composition is 3 mass % or less based on the total amount of the photosensitive resin composition from the standpoint of preventing diffusion of the organic solvent at a later process.

It is preferable that the thickness of the photosensitive layer after drying is, although the preferable thickness is different depending on a use application, 5 to 200 µm, more preferably 15 to 60 µm, particularly preferably 20 to 50 µm. When the thickness is less than 5 µm, it tends to be difficult to coat industrially, and when the thickness of the photosensitive layer exceeds 200 µm, sensitivity and resolution inside of the photosensitive layer tend to be lowered.

The photosensitive film may further comprise an intermediate layer such as a cushion layer, an adhesion layer, a light absorbing layer, or a gas barrier layer. Moreover, the obtained photosensitive film can be stored in a sheet shape or in a roll shape wound on a winding core. In this case, in addition, it is preferable that the photosensitive layer is wound so that the support becomes the outermost layer. It is preferable to install an end face separator at an end face of the photosensitive film roll in a roll shape from the standpoint of protection of the end face, and it is preferable to install a moistureproof end face separator from the standpoint of edge fusion resistance. In addition, edge fusion means a phenomenon that a photosensitive resin composition oozes from the end face of the roll when the photosensitive film is stored by being wound in a roll shape. Moreover, as a packaging method, it is preferable to pack the photosensitive film by wrapping the photosensitive film in a black sheet having a low permeability. Examples of the winding core include plastics such as polyethylene resins, polypropylene resins, polystyrene resins, polyvinyl chloride resins, and ABS resins (acrylonitrile-butadiene-styrene copolymer).

[Method for Forming Resist Pattern]

Next, a method for forming a resist pattern using the photosensitive film according to the present embodiment will be described.

In the first place, a photosensitive layer comprising the above-described photosensitive resin composition is formed on the substrate on which a resist is to be formed. Specifically, the photosensitive film is adhered by lamination or the like to a conductor layer having a circuit pattern formed on the substrate so that the photosensitive layer covers the conductor layer. In the case where the photosensitive film has a protective film on the photosensitive layer, the protective film is peeled from the photosensitive film, and an exposed face is adhered on the conductor layer having a circuit pattern formed on the substrate so that the exposed face covers the conductor layer. It is preferable that the adhesion is carried out under reduced pressure from the standpoint of improving adhesiveness and followability. In addition, the photosensitive resin composition can also be coated on the substrate by coating varnish of the photosensitive resin composition by known methods such as a screen printing method or a coating method with a roll coater.

Next, an exposure step of forming a photocured part is carried out by irradiating a predetermined part of the photosensitive layer with an active ray through a mask pattern and photocuring the photosensitive layer of the irradiated part.

Further, a resist pattern can be formed, after removing the support in the case where the support is present on the photosensitive layer, by removing the part where photocuring is not carried out (unexposed part) and carrying out development by wet development or dry development.

In the case of the wet development, a developing solution that is safe and stable and has good operability such as an alkaline aqueous solution, a water based developing solution, or an organic solvent is used as a developing solution in accordance with the kind of photosensitive resin composition.

As the developing solution, the alkaline aqueous solution is preferable. As a base of the alkaline aqueous solution, a base that is safe and stable and has good operability is used. Examples of the base include hydroxides of alkaline metals such as lithium, sodium, and potassium, the hydroxides such as lithium hydroxide, sodium hydroxide, and potassium hydroxide; carbonates or bicarbonates of alkaline metals or ammonium such as alkaline carbonates and ammonium carbonates, or alkaline bicarbonates; phosphates of alkaline metals such as sodium phosphate and potassium phosphate; and pyrophosphates of alkaline metals such as sodium pyrophosphate and potassium pyrophosphate.

As the alkaline aqueous solution, it is preferable to use, for example, a 0.1 to 5 mass % sodium carbonate dilute solution, a 0.1 to 5 mass % potassium carbonate dilute solution, a 0.1 to 5 mass % sodium hydroxide dilute solution, and a 0.1 to 5 mass % sodium tetraborate dilute solution, and it is preferable that the pH is in the range of 9 to 11. Moreover, the temperature of such an alkaline aqueous solution is adjusted in accordance with the developability of the photosensitive layer, and it is preferable that the temperature of the alkaline aqueous solution is adjusted to 20 to 50° C. Furthermore, a small amount of an organic solvent such as a surfactant or a defoaming agent may be mixed in the alkaline aqueous solution for the purpose of accelerating development.

A water based developing solution comprising water, and alkaline aqueous solution or organic solvents of one or more kinds is used as the water based developing solution. Here, Examples of the base of the alkaline aqueous solution include, in addition to the above-described bases, borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2, morpholine. It is preferable that the pH of such a water based developing solution is made as small as possible in the range that developing processing can be sufficiently carried out, pH 8 to 12 is preferable, and pH 9 to 10 is more preferable.

As the organic solvent, for example, acetone, ethyl acetate, alkoxy ethanols having an alkoxy group having 1 to 4 carbon atoms, ethyl alcohol, isopropyl alcohol, butyl alcohol, diethylene glycol monomethyl ether, diethylene glycol monoethyl ether, diethylene glycol monobutyl ether, 1,1,1-trichloroethane, N-methylpyrrolidone, N,N-dimethylformamide, cyclohexanone, methyl isobutyl ketone, or γ-butyrolactone is used. It is preferable that the concentration of such an organic solvent is usually 2 to 90 mass %. Moreover, the temperature of such an organic solvent can be adjusted in accordance with the developability. Furthermore, such an organic solvent can be used alone or in combination of two or more kinds. Examples of the organic solvent based developing solution to be used alone include 1,1,1-trichloroethane, N-methylpyrrolidone, N,N-dimethylformamide, cyclohexanone, methyl isobutyl ketone, and γ-butyrolactone.

As the method for developing a resist pattern include a dipping system, a paddle system, a spray system, a high-pressure spray system, brushing, and slapping, and the high-pressure spray system is the most suitable for improving resolution. Two or more kinds of the above-described methods for developing may be used together as necessary in the method for forming a resist pattern. In etching of the metal face carried out after development, a cupric chloride solution, a ferric chloride solution, or an alkaline etching solution for example can be used.

[Permanent Resist]

A preferred embodiment of a permanent resist using the photosensitive film will be described.

After the completion of the development step, it is preferable to carry out UV irradiation with a high-pressure mercury lamp or heating for the purpose of improving solder heat resistance, chemical resistance, or the like. In the case of UV light irradiation, the amount of the irradiation can be adjusted as necessary, and the irradiation can be carried out by an amount of irradiation of, for example, about 0.05 to about 10 J/cm$^2$. Moreover, in the case where the resist pattern is heated, it is preferable that the heating is carried out in the range of about 130 to about 200° C. for about 15 to about 90 minutes.

Both of the UV irradiation and the heating may be carried out. In this case, both may be carried out simultaneously, or any one of the two may be carried out first and thereafter the other one may be carried out. In the case where the UV irradiation and the heating are carried out simultaneously, it is preferable that the heating is carried out in the range of 60 to 150° C. from the standpoint of imparting solder heat resistance and chemical resistance more favorably.

The permanent resist thus formed also works as a protection film for a wiring after soldering on the substrate, has properties of solder resist, and can be used as a solder resist for a printed wiring board, a semiconductor package substrate, and a flexible wiring board.

The solder resist is used as, for example, a plating resist or etching resist in the case where plating or etching is carried out to the substrate, and besides, is left as it is on the substrate, and is used as a protection film (permanent resist) to protect wiring or the like.

Moreover, in the case where exposure is performed using a mask or drawing data having a pattern by which a predetermined part in the conductor layer is unexposed in the exposure step, a resist having an opening pattern in which the unexposed part is removed and a part of the conductor layer formed on the substrate is exposed can be obtained by developing the conductor layer. It is preferable to carry out a processing necessary for forming the permanent resist thereafter.

[Semiconductor Package]

Figure 1:
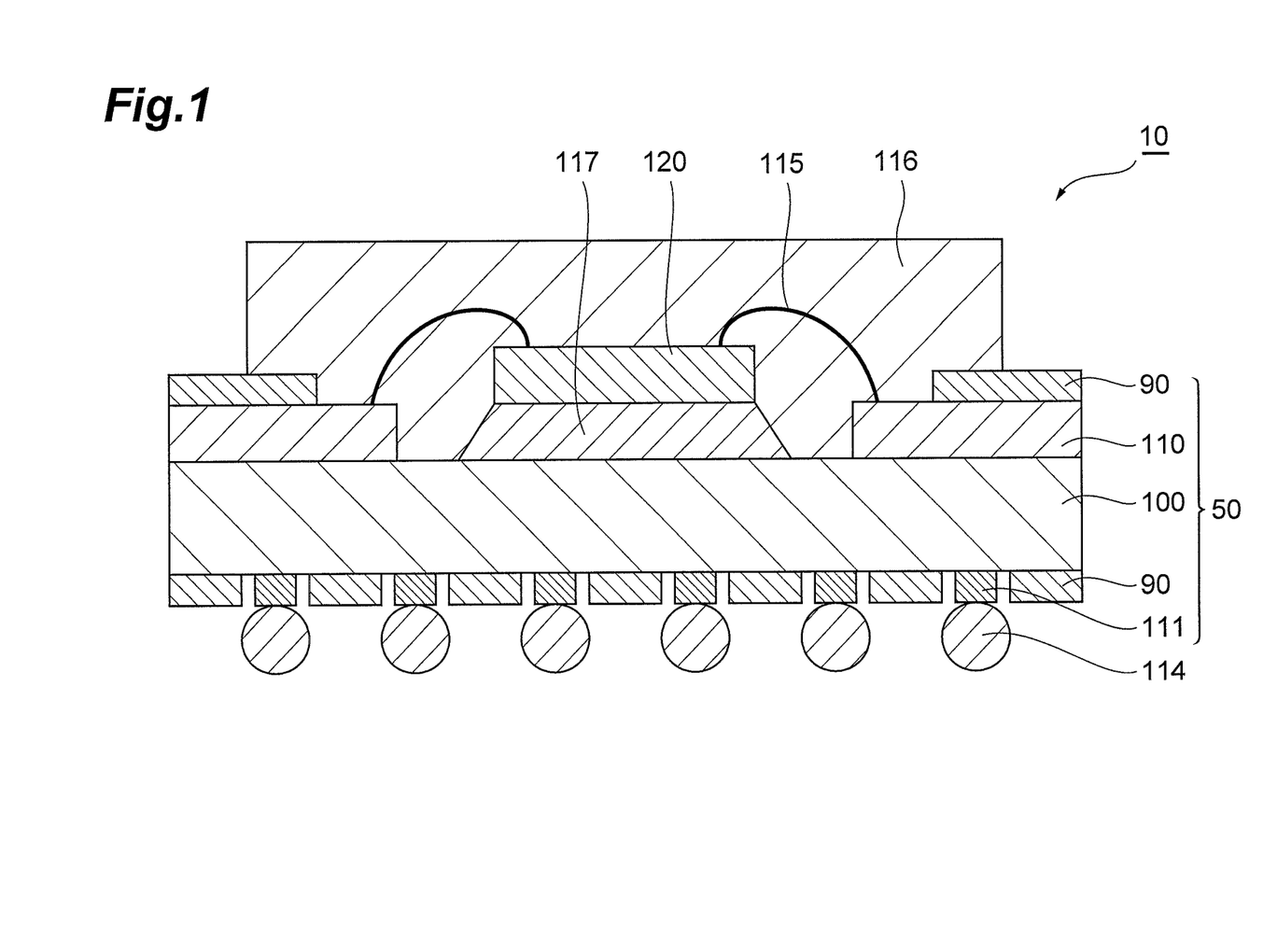
FIG. 1 is a schematic cross sectional view of a semiconductor package substrate.

The photosensitive resin composition of the present embodiment can be used favorably for forming a permanent resist of a printed wiring board for a semiconductor package. Namely, the present invention provides a semiconductor package having a permanent resist layer comprising a cured product of the photosensitive resin composition. FIG. 1 is a schematic cross sectional view showing one embodiment of a semiconductor package. The semiconductor package 10 comprises a substrate 50 for mounting a semiconductor chip and a semiconductor chip 120 mounted on the substrate 50 for mounting a semiconductor chip. The substrate 50 for mounting a semiconductor chip and the semiconductor chip 120 are adhered by an adhesive 117 comprising a die bond film or die bond paste. The substrate 50 for mounting a semiconductor chip comprises an insulating substrate 100, and on one face of the insulating substrate 100, a wiring terminal 110 for wire bonding and a permanent resist layer 90 in which an opening where a part of the wiring terminal 110 is exposed are provided, and the permanent resist layer 90 and a connection terminal 111 for solder connection are provided on the other face. The permanent resist layer 90 is a layer comprising a cured product of the photosensitive resin composition of the present embodiment. The connection terminal 111 for solder connection mounts a solder ball 114 for the purpose of carrying out electrical connection to a printed wiring board. The semiconductor chip 120 and the wiring terminal 110 for wire bonding are electrically connected by using a gold wire 115. The semiconductor chip 120 is sealed by a sealing resin 116 for a semiconductor. In addition, the photosensitive resin composition of the present embodiment can also be applied to a flip chip type semiconductor package.

Figure 2:
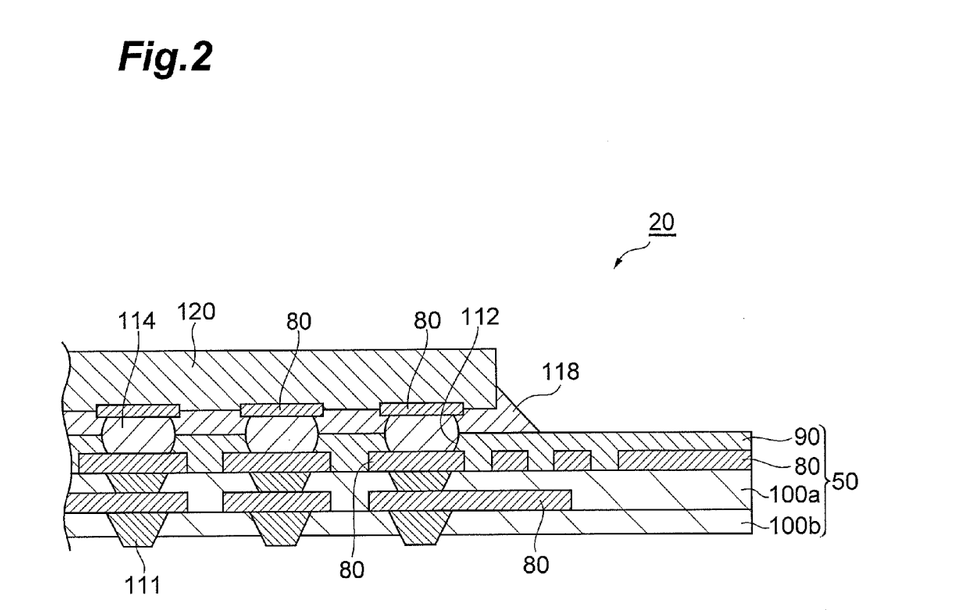
FIG. 2 is a schematic cross sectional view of a flip-chip type package substrate.

FIG. 2 is a schematic cross sectional view showing a flip chip type semiconductor package substrate. A flip chip type semiconductor package substrate 20 comprises a substrate 50 for mounting a semiconductor chip and a semiconductor chip 120 mounted on the substrate 50 for mounting a semiconductor chip. The substrate 50 for mounting a semiconductor chip and the semiconductor chip 120 are filled with an underfill agent 118. The substrate 50 for mounting a semiconductor chip has a constitution in which an insulating substrate 100$b$, an insulating substrate 100$a$, and a permanent resist layer 90 are laminated in this order. The permanent resist layer 90 is a layer comprising a cured product of the photosensitive resin composition of the present embodiment. The insulating substrate 100$b$ has a copper wiring 80 patterned on the surface of the insulating substrate 100$a$ side, and the insulating substrate 100$a$ has a copper wiring 80 patterned on the surface of the permanent resist layer 90 side. The copper wiring 80 on the insulating substrate 100$b$ and at least a part of the copper wiring 80 on the insulating substrate 100$a$ are electrically connected by a connection terminal 111 for solder connection formed so as to penetrate the insulating substrate 100$a$ and the insulating substrate 100$b$. Moreover, the permanent resist layer 90 is formed so as to cover the copper wiring 80 on the insulating substrate 100$a$, but an opening 112 is formed on the copper wiring 80 corresponding to the connection terminal 111 for solder connection so that the copper wiring 80 is exposed. The copper wiring 80 on the insulating substrate 100$a$ is electrically connected to the copper wiring 80 formed on the face facing the substrate 50 for mounting a semiconductor chip of the semiconductor chip 120 through a solder ball 114 provided at the opening 112.

Thereafter, the substrate comprising the permanent resist is installed in an electronic apparatus such as a personal computer.

The present invention has been described hereinbefore based on the embodiments. However, the present invention is not limited to the embodiments and various variations are possible within the range not deviating from the gist of the present invention.

It can also be said that the present invention is an invention relating to, for example, application of the photosensitive resin composition. Namely, an aspect of the present invention is the application of a photosensitive resin composition for production of a photosensitive film, the photosensitive resin composition comprising an (a) component: an acid-modified epoxy resin, a (b) component: a photopolymerizable monomer having an ethylenically unsaturated group, a (c) component: a photopolymerization initiator, a (d) component: an epoxy resin, and an (e) component: an inorganic filler, wherein the (a) component comprises an acid-modified bisphenol novolak type epoxy resin and further the photosensitive resin composition satisfies at least one of the conditions shown in the following (I) and (II):

(I) the (b) component comprises a photopolymerizable monomer having a tricyclodecane structure and a urethane bond; and (II) the (e) component comprises a silica filler having a maximum particle size of 1 μm or less in an amount of more than 60 parts by mass based on a total of 100 parts by mass of the (a) component and the (b) component.

Moreover, another aspect of the present invention is the application of a photosensitive resin composition as a photosensitive resin composition for producing a permanent resist, the photosensitive composition comprising an (a) component: an acid-modified epoxy resin, a (b) component: a photopolymerizable monomer having an ethylenically unsaturated group, a (c) component: a photopolymerization initiator, a (d) component: an epoxy resin, and (e) component: an inorganic filler, wherein the (a) component comprises an acid-modified bisphenol novolak type epoxy resin and further the photosensitive resin composition satisfies at least one of the conditions shown in the above (I) and (II).

Yet another aspect of the present invention is the application of a cured product of a photosensitive resin composition to a permanent resist, the photosensitive composition comprising an (a) component: an acid-modified epoxy resin, a (b) component: a photopolymerizable monomer having an ethylenically unsaturated group, a (c) component: a photopolymerization initiator, a (d) component: an epoxy resin, and (e) component: an inorganic filler, wherein the (a) component comprises an acid-modified bisphenol novolak type epoxy resin and further the photosensitive resin composition satisfies at least one of the conditions shown in the above (I) and (II).

EXAMPLES

Hereinafter, the present invention will be described more specifically by Examples, but the present invention is not limited to the Examples.

(Preparation of Photosensitive Film)

Photosensitive resin compositions of Examples 1 to 16 and Comparative Examples 1 to 15 were obtained by mixing the respective components shown in Tables 1 to 3 in the respective blending ratios (based on mass) shown therein. In addition, methyl ethyl ketone was used as a solvent.

The following components were used as each component shown in Tables 1 to 3.

[(a) Component]

EXP-3133: Bisphenol F novolak type acid-modified epoxy resin (weight average molecular weight 7000, acid value 63 mg KOH/g, manufactured by DIC Corporation.)

EXP-3135: Bisphenol F novolak type acid-modified epoxy resin (weight average molecular weight 8000, acid value 75 mg KOH/g, manufactured by DIC Corporation.)

EXP-2810: Cresol novolak type acid-modified epoxy acrylate (weight average molecular weight 7000, acid value 65 mg KOH/g, manufactured by DIC Corporation.)

ZFR-1158: Bisphenol F type acid-modified epoxy acrylate (weight average molecular weight 10000 acid value 65 mg KOH/g, manufactured by Nippon Kayaku Co., Ltd.)

UXE-3024: Urethane-modified bisphenol A type acid-modified epoxy acrylate (weight average molecular weight 10000, acid value 67 mg KOH/g, manufactured by Nippon Kayaku Co., Ltd.)

[Method for Measuring Acid Value]

The acid value was measured as described next. In the first place, a binder polymer was heated at 130° C. for 1 hour, and volatile components were removed to obtain a solid. And after 1 g of a polymer of which acid value was to be measured was precisely weighed, 30 g of acetone was added to the polymer, and the resultant mixture was uniformly dissolved. Next, phenolphthalein being an indicator was added to the solution by an appropriate amount, and titration was carried out using a 0.1 N KOH aqueous solution. And the acid value was calculated by the following formula.

$$\text{Acid value} = 10 \times Vf \times 56.1/(Wp \times I)$$

In the formula, Vf represents titer of phenolphthalein (mL), Wp represents weight of the measured binder polymer solution (g), and I represents the rate of nonvolatile components in the measured binder polymer solution (mass %).

[Measurement of Weight Average Molecular Weight]

The weight average molecular weight (Mw) was measured by a gel permeation chromatography method (GPC) and derived by converting the measured value using a calibration curve of a standard polystyrene. The conditions of the GPC are shown below.

Conditions of GPC

Pump: Hitachi L-6000 type (manufactured by Hitachi Ltd, product name)

Column: Gelpack GL-R420, Gelpack GL-R430, and Gelpack GL-R440 (all manufactured by Hitachi Chemical Co., Ltd., product name)

Eluent: Tetrahydrofuran

Measurement Temperature: 40° C.

Flow rate: 2.05 mL/minute

Detector: Hitachi L-3300 type RI (manufactured by Hitachi Ltd, product name)

[(b) Component]

UX-D5002-M20: Urethane acrylate having a tricyclodecane structure (weight average molecular weight 3500, manufactured by Nippon Kayaku Co., Ltd.)

UX-D5002-P20: Urethane acrylate having a tricyclodecane structure (weight average molecular weight 3500, manufactured by Nippon Kayaku Co., Ltd.)

NK-DCP: Tricyclodecane dimethanol dimethacrylate (weight average molecular weight 332, manufactured by Shin-Nakamura Chemical Co., Ltd.)

DPHA: Dipentaerythritol hexaacrylate (weight average molecular weight 578, manufactured by Nippon Kayaku Co., Ltd.)

FA-321M: Bisphenol A polyoxyethylene dimethacrylate (weight average molecular weight 836, manufactured by Hitachi Chemical Co., Ltd.)

[(c) Component]

I-907: 2-methyl-1-(4-methylthiophenyl)-2-morpholinopropane-1-on (IRGACURE-907, manufactured by BASF Corporation)

DETX-S: 2,4-diethyl thioxanthone (KAYACURE-DETX-S, manufactured by Nippon Kayaku Co., Ltd.)

TPO: 2,4,6-trimethylbenzoyl-diphenyl-phosphine oxide (LUCIRIN-TPO, manufactured by BASF Corporation)

OXE-02:

Ethanone, 1-[9-ethyl-6-(2-methylbenzoyl)-9H-carbazole-3-yl]-,1-(O-acetyloxime) (IRGACURE-OXE-02, manufactured by BASF Corporation)

[(d) Component]

EXA-7372: Bisphenol F novolak type epoxy resin (manufactured by DIC Corporation)

NC-3000H: Phenol biphenyl aralkyl type epoxy resin (manufactured by Nippon Kayaku Co., Ltd.)

YSLV-80: Bisphenol F type epoxy resin (manufactured by Nippon Steel Chemical Co., Ltd.)

[(e) Component]

Silica filler A: A silica filler having an average particle size of 100 nm in which a silane coupling treatment was carried out with 3-methacryloxypropyltrimethoxysilane being a methacryl silane as a silane coupling agent was prepared. And the silica filler was used by being dispersed in the resin of the (a) component. When the dispersion state was measured by using a laser diffraction type micro track particle size distribution measuring apparatus HRA-X100 (manufactured by Nikkiso Co., Ltd.), the average particle size was 50 nm, the maximum particle size was 204 nm. Moreover, the measurement was carried out in the same manner as described above every time each evaluation was carried out, and as a result thereof, it was confirmed that the average particle size was 100 nm or less and the maximum particle size was 1 μm or less at every time when evaluation was carried out.

Silica filler B: A pulverized crystalline silica as a silica filler having an average particle size of 800 nm was prepared. The pulverized crystalline silica was used by being dispersed in the resin (a) with a three-roll mill. When the dispersion state was measured by using a laser diffraction type micro track particle size distribution measuring apparatus HRA-X100 (manufactured by Nikkiso Co., Ltd.), the average particle size was 546 nm, the maximum particle size was 3.8 μm. Moreover, the measurement was carried out in the same manner as described above every time each evaluation was carried out, and as a result thereof, it was confirmed that the average particle size was 800 nm or less and the maximum particle size was 5 μm or less at every time when evaluation was carried out.

Barium sulfate: Barium sulfate having an average particle size of 200 μm was prepared as a filler. The barium sulfate was used as a dispersion liquid prepared by the method described below. A barium sulfate dispersion liquid was prepared by putting a photopolymerizable monomer having an ethylenically unsaturated group (the (b) component and/or a component different from the (b) component), barium sulfate, melamine, and methyl ethyl ketone into Starmill LMZ (manufactured by Ashizawa Finetech Ltd.) in an amount described in Table 1 or 2 respectively and dispersing the resultant mixture at a peripheral speed of 12 m/s for 3 hours with zirconia beads having a diameter of 1.0 mm.

Aluminum oxide (alumina): A dispersion slurry of an aluminum oxide having an average particle size of 50 nm and dispersed in methyl isobutyl ketone (ALMMIBK-H06, manufactured by CIK Nanotech Co.)

[Other Components]

Polymerization inhibitor: AW-300, manufactured by Kawaguchi Chemical Industry Co., Ltd., weight average molecular weight 380, melting point 205° C.

Dicyandiamide: manufactured by Mitsubishi Chemical Corporation.

Melamine: manufactured by Nissan Chemical Industries, Ltd.

Pigment: HCP-PM-5385 manufactured by Toyo Ink Co., Ltd.

Phthalocyanine Blue: manufactured by Nippon Pigment Co., Ltd.

A solution of photosensitive resin composition was prepared by using each component described above under the condition described in Tables 1 to 3. Next, the prepared solution of the photosensitive resin composition was uniformly coated on a polyethylene terephthalate film as a support layer having a thickness of 16 μm (G2-16, manufactured by Teijin Ltd.) to thereby form a photosensitive layer, and the photosensitive layer was dried at 100° C. for about 10 minutes using a hot air convection type drier. The thickness of the photosensitive layer after drying was 25 μm.

Subsequently, a polyethylene film (NF-15, manufactured by Tamapoly Co., Ltd.) is laminated as a protective film on the surface opposite to the side being in contact with the support layer of the photosensitive layer to obtain a photosensitive film comprising a support layer/photosensitive layer/protection film.

TABLE 1

| | | Example | | | | | | | | | | | |
|---|---|---|---|---|---|---|---|---|---|---|---|---|---|
| | Component | 1 | 2 | 3 | 4 | 5 | 6 | 7 | 8 | 9 | 10 | 11 | 12 |
| (a) | EXP-3133 | 60 | — | 60 | 50 | 60 | 40 | 40 | 60 | 60 | 60 | 60 | 60 |
| | EXP-3135 | — | 60 | — | — | — | — | — | — | — | — | — | — |
| | EXP-2810 | — | — | — | — | — | 20 | — | — | — | — | — | — |
| | ZFR-1158 | — | — | — | — | — | — | — | — | — | — | — | — |
| | UXE-3024 | — | — | — | — | — | — | 20 | — | — | — | — | — |
| (b) | UX-5002D-M20 | 18 | 18 | — | 28 | 18 | 18 | 18 | 18 | 18 | 18 | 18 | 18 |
| | UX-5002D-P20 | — | — | 18 | — | — | — | — | — | — | — | — | — |
| | NK-DCP | 12 | 12 | 12 | 12 | — | 12 | 12 | 12 | 12 | 12 | 12 | 12 |
| | DPHA | — | — | — | — | 12 | — | — | — | — | 10 | 10 | 10 |
| | FA-321M | 10 | 10 | 10 | 10 | 10 | 10 | 10 | 10 | 10 | — | — | — |
| (c) | I-907 | 3.0 | 3.0 | 3.0 | 3.0 | 3.0 | 3.0 | 3.0 | — | 3.0 | 3.0 | 3.0 | 3.0 |
| | DETX-S | 0.2 | 0.2 | 0.2 | 0.2 | 0.2 | 0.2 | 0.2 | — | 0.2 | 0.2 | 0.2 | 0.2 |
| | TPO | — | — | — | — | — | — | — | 3.0 | — | — | — | — |
| | OXE-02 | — | — | — | — | — | — | — | 0.1 | — | — | — | — |
| (d) | EXA-7372 | — | — | — | — | — | — | — | — | 25 | — | 25 | 25 |
| | NC-3000H | 25 | 25 | 25 | 25 | 25 | 25 | 25 | 25 | — | — | — | — |
| | YSLV-80 | — | — | — | — | — | — | — | — | — | 25 | — | — |
| (e) | Silica filler A | 60 | 60 | 60 | 60 | 60 | 60 | 60 | 60 | 60 | 60 | 90 | 30 |
| | Silica filler B | — | — | — | — | — | — | — | — | — | — | — | — |
| | Barium sulfate | 30 | 30 | 30 | 30 | 30 | 30 | 30 | 30 | 30 | 30 | — | — |
| | Alumina | — | — | — | — | — | — | — | — | — | — | — | — |
| Other components | Polymerization inhibitor | 1.0 | 1.0 | 1.0 | 1.0 | 1.0 | 1.0 | 1.0 | 1.0 | 1.0 | 1.0 | 1.0 | 1.0 |
| | Dicyandiamide | 1.0 | 1.0 | 1.0 | 1.0 | 1.0 | 1.0 | 1.0 | 1.0 | 1.0 | 1.0 | 1.0 | 1.0 |
| | Melamine | 2.0 | 2.0 | 2.0 | 2.0 | 2.0 | 2.0 | 2.0 | 2.0 | 2.0 | 2.0 | 2.0 | 2.0 |
| | Pigment | 1.2 | 1.2 | 1.2 | 1.2 | 1.2 | 1.2 | 1.2 | 1.2 | 1.2 | 1.2 | 1.2 | 1.2 |

TABLE 2

| | | Comparative Example | | | | | | | | | | | |
|---|---|---|---|---|---|---|---|---|---|---|---|---|---|
| | Component | 1 | 2 | 3 | 4 | 5 | 6 | 7 | 8 | 9 | 10 | 11 | 12 |
| (a) | EXP-3133 | 75 | — | — | — | 75 | 60 | — | — | — | — | — | — |
| | EXP-3135 | — | — | — | — | — | — | — | — | — | — | — | — |
| | EXP-2810 | — | 75 | — | — | — | — | 60 | — | 60 | 60 | 60 | 60 |
| | ZFR-1158 | — | — | 75 | — | — | — | — | — | — | — | — | — |
| | UXE-3024 | — | — | — | 75 | — | — | — | 60 | — | — | — | — |
| (b) | UX-5002D-M20 | — | — | — | — | — | — | 18 | 18 | 18 | 18 | 18 | 18 |
| | UX-5002D-P20 | — | — | — | — | — | — | — | — | — | — | — | — |
| | NK-DCP | — | — | — | — | 15 | 25 | 12 | 12 | 12 | 12 | 12 | 12 |
| | DPHA | 15 | 15 | 15 | 15 | — | — | — | — | — | — | — | — |
| | FA-321M | 10 | 10 | 10 | 10 | 10 | 10 | 10 | 10 | 10 | 10 | 10 | 10 |
| (c) | I-907 | 3.0 | 3.0 | 3.0 | 3.0 | 3.0 | 3.0 | 3.0 | 3.0 | 3.0 | 3.0 | 3.0 | 3.0 |
| | DETX-S | 0.2 | 0.2 | 0.2 | 0.2 | 0.2 | 0.2 | 0.2 | 0.2 | 0.2 | 0.2 | 0.2 | 0.2 |
| | TPO | — | — | — | — | — | — | — | — | — | — | — | — |
| | OXE-02 | — | — | — | — | — | — | — | — | — | — | — | — |
| (d) | EXA-7372 | — | — | — | — | — | — | — | — | — | — | — | — |
| | NC-3000H | 25 | 25 | 25 | 25 | — | 25 | 25 | 25 | 25 | 25 | 25 | 25 |
| | YSLV-80 | — | — | — | — | 25 | — | — | — | — | — | — | — |

TABLE 2-continued

|  | Component | Comparative Example | | | | | | | | | | | |
|---|---|---|---|---|---|---|---|---|---|---|---|---|---|
|  |  | 1 | 2 | 3 | 4 | 5 | 6 | 7 | 8 | 9 | 10 | 11 | 12 |
| (e) | Silica filler A | 60 | 60 | 60 | 60 | 60 | 60 | 60 | 60 | — | — | — | — |
|  | Silica filler B | — | — | — | — | — | — | — | — | 60 | 90 | — | 90 |
|  | Barium sulfate | 30 | 30 | 30 | 30 | 30 | 30 | 30 | 30 | 30 | — | — | — |
|  | Alumina | — | — | — | — | — | — | — | — | — | — | 90 | — |
| Other components | Polymerization inhibitor | 1.0 | 1.0 | 1.0 | 1.0 | 1.0 | 1.0 | 1.0 | 1.0 | 1.0 | 1.0 | 1.0 | 1.0 |
|  | Dicyandiamide | 1.0 | 1.0 | 1.0 | 1.0 | 1.0 | 1.0 | 1.0 | 1.0 | 1.0 | 1.0 | 1.0 | 1.0 |
|  | Melamine | 2.0 | 2.0 | 2.0 | 2.0 | 2.0 | 2.0 | 2.0 | 2.0 | 2.0 | 2.0 | 2.0 | 2.0 |
|  | Pigment | 1.2 | 1.2 | 1.2 | 1.2 | 1.2 | 1.2 | 1.2 | 1.2 | 1.2 | 1.2 | 1.2 | 1.2 |

TABLE 3

|  | Component | Example | | | | Comparative Example | | |
|---|---|---|---|---|---|---|---|---|
|  |  | 13 | 14 | 15 | 16 | 13 | 14 | 15 |
| (a) | EXP-3133 | 75 | — | 75 | 75 | — | — | 75 |
|  | EXP-3135 | — | 75 | — | — | — | — | — |
|  | ZFR-1158 | — | — | — | — | 75 | 75 | — |
| (b) | DPHA | 10 | 10 | 10 | 10 | 10 | 10 | 10 |
|  | FA-321M | 15 | 15 | 15 | 15 | 15 | 15 | 15 |
| (c) | TPO | 2.0 | 2.0 | 2.0 | 2.0 | 2.0 | 2.0 | 2.0 |
|  | OXE-02 | 0.1 | 0.1 | 0.1 | 0.1 | 0.1 | 0.1 | 0.1 |
| (d) | EXA-7372 | 30 | 30 | 30 | — | — | 30 | 30 |
|  | YSLV-80 | — | — | — | 30 | 30 | — | — |
| (e) | Silica filler A | 100 | 100 | 70 | 100 | 100 | — | — |
|  | Silica filler B | — | — | — | — | — | 70 | 100 |
| Other components | Dicyandiamide | 1.0 | 1.0 | 1.0 | 1.0 | 1.0 | 1.0 | 1.0 |
|  | Melamine | 2.0 | 2.0 | 2.0 | 2.0 | 2.0 | 2.0 | 2.0 |
|  | Phthalocyanine blue | 0.5 | 0.5 | 0.5 | 0.5 | 0.5 | 0.5 | 0.5 |

(Characteristics Evaluation)

[Evaluation of Film Coatability]

The polyethylene terephthalate film of the obtained photosensitive film was peeled without carrying out exposure to the photosensitive film obtained, a finger was lightly pressed onto the surface of the coating film, and the extent of sticking to the finger was evaluated according to the following criteria. Namely, a film with which sticking to the finger was not observed, sticking to the finger was hardly observed, or slight sticking to the finger was observed was defined as "3", a film with which sticking to the finger was observed was defined as "2", and a film with which sticking to the finger strong enough to the extent that the resin adhered to the finger was observed was defined as "1". The results were shown in Tables 4 to 6.

[Evaluation of Resolution]

A copper surface of a substrate for a printed wiring board (E-679, manufactured by Hitachi Chemical Co., Ltd.) obtained by laminating a copper foil having a thickness of 12 µm on a glass epoxy substrate was polished with an abrasive grain brush, washed with water, and thereafter dried. The polyethylene film of the photosensitive film was peeled and laminated on the substrate for a printed wiring board under the conditions of a hot plate temperature of hot press of 70° C., a vacuum evacuation time of 20 seconds, a lamination press time of 30 seconds, an air pressure of 4 kPa or less, and a crimp pressure of 0.4 MPa by using a continuous press type vacuum laminator (MVLP-500, manufactured by Meiki Co., Ltd.) to obtain a laminated substrate for evaluation.

A photo tool having a 2 mm square pattern as a negative was adhered closely on the laminated substrate for evaluation, and exposure was carried out using a EXM-1201 type exposure machine manufactured by Orc Manufacturing Co., Ltd. by an energy amount in such a way the number of residual steps became 8.0 after developing of Stauffer 21-step tablet. Next, the laminated substrate for evaluation was left statically for 1 hour at 25° C., thereafter the polyethylene terephthalate film on the laminated substrate for evaluation was peeled, and spray development was carried out with a 1 mass % sodium carbonate aqueous solution having a temperature of 30° C. in 2.0 times as long as the minimum development time (the minimum time for an unexposed part to be developed) to form a pattern.

As the evaluation of resolution in this case, a laminated substrate for evaluation in which an unexposed part of φ30 µm was developed and an opening pattern was obtained as a favorable resist shape was defined as "3", a laminated substrate for evaluation in which a resist shape was overhang, but an opening pattern was obtained was defined as "2", and a laminated substrate for evaluation in which an opening pattern was not obtained was defined as "1". The results were shown in Tables 4 to 6.

[Evaluation of Gold Plating Resistance]

The laminated substrate for evaluation on which the solder resist having a 2 mm square opening was formed was plated with a commercially available electroless nickel/gold plating solution so as to have a nickel plating thickness of 5 µm and a gold plating thickness of 0.1 µM, and the appearance of the solder resist was observed with a stereomicroscope and evaluated according to the following criteria. Namely, a laminated substrate for evaluation in which whitening of the solder resist was not observed in the periphery of the opening was defined as "3", a laminated substrate for evaluation in which whitening, peeling of 10 µm or less occurred was defined as "2", and a laminated substrate for evaluation in which whitening, peeling occurred largely was defined as "1". The results were shown in Tables 4 to 6.

[Evaluation of Tg and CTE]

A cured product of a solder resist was formed on a polyethylene terephthalate film having a thickness of 16 µm (G2-16, manufactured by Teijin Ltd.) by exposing the whole face of the photosensitive film and carrying out development, UV irradiation, and heat treatment, then the cured product was cut with a box cutter in a shape having a width of 3 mm and a length of 30 mm, and thereafter the polyethylene terephthalate of the photosensitive film was peeled to obtain a cured product of the photosensitive resin for evaluation of coefficient of thermal expansion. The measurement of the coefficient of thermal expansion in a tension mode was carried out by using a TMA apparatus SS6000 (manufactured by Seiko Instruments Inc.). The tension load was 2 g, the span (distance between chucks) was 15 mm, and the temperature increasing rate was 10° C./minute. Firstly, the sample was mounted on the apparatus, heated from room temperature (25° C.) to 160° C., and left for 15 minutes. Thereafter, the sample was cooled to −60° C., and the measurement was carried out from −60° C.

to 250° C. under the condition of a temperature increasing rate of 10° C./minute. An inflection point observed in the range of 25° C. to 200° C. was defined as Tg, the sample of which temperature of Tg was 120° C. or more was defined as "3", the sample of which temperature of Tg was from 100° C. to less than 120° C. was defined as "2", and the sample of which temperature of Tg was 100° C. or less was defined as "1". The CTE was determined using the slope of the tangent of the curve obtained in the temperature of Tg or below. The CTE value obtained in Example 1 was used as a reference value, and a sample of which CTE value was 70% or less based on the reference value was defined as "4", a sample of which CTE value was more than 70% and less than 130% was defined as "3", the sample of which CTE value was 130% or more and less than 150% was defined as "2", and the sample of which CTE value was 150% or more was defined as "1". The results were shown in Tables 4-to 6.

[Evaluation of HAST Resistance]

A comb-shaped electrode having a line/space of 8 µm/8 µm was prepared using as core materials: a substrate for printed wiring board (MCL-E-679FG, manufactured by Hitachi Chemical Co., Ltd.) obtained by laminating a copper foil having a thickness of 12 µm on a glass epoxy base material; and a build-up material for forming semi-additive wiring (AS-ZII, manufactured by Hitachi Chemical Co., Ltd.), and the comb-shaped electrode was used as a substrate for evaluation. A solder resist comprising a cured product of a resist was formed on the comb-shaped electrode in the substrate for evaluation in the same manner as in the "Evaluation of Resolution" (formed by exposing in such a way that the solder resist was left at the comb-shaped electrode part and carrying out development, UV irradiation, and heat treatment), and then the solder resist was exposed to the environment of 130° C. and 85% RH for 200 hours while the voltage of 6 V was applied. Thereafter, the resistance value was measured, the extent of occurrence of migration in the solder resist was observed with a metallographical microscope of 100 magnifications, and the evaluation was carried out according to the following criteria. Namely, a substrate for evaluation in which a resistance value of $1.0 \times 10^{10} \Omega$ or more was maintained and migration did not occur in the solder resist film was defined as "3", a substrate for evaluation in which a resistance value of $1.0 \times 10^{10} \Omega$ or more was maintained but migration occurred slightly in the solder resist film was defined as "2", and a substrate for evaluation in which the resistance value was less than $1.0 \times 10^{10} \Omega$, and migration occurred largely in the solder resist film was defined as "1". The results were shown in Tables 4 to 6.

[Evaluation of Crack Resistance]

The heat cycle in which the laminated substrate for evaluation formed solder resist in the same manner as in the "preparation of substrate for evaluation" was exposed to the atmosphere having a temperature of −65° C. for 15 minutes, thereafter the temperature was increased at a temperature increasing rate of 180° C./minute, then the laminated substrate for evaluation was exposed to the atmosphere having a temperature of 150° C. for 15 minutes, and then the temperature was decreased at a temperature decreasing rate of 180° C./minute was repeated 1000 times. After the laminated substrate for evaluation was exposed to such environment, the extent of crack and peeling of the permanent resist of the laminated substrate for evaluation was observed with a metallographical microscope of 100 magnifications and evaluated according to the following criteria. Namely, when 10 parts of the opening of 2 mm square were checked, a laminated substrate for evaluation in which cracks and peelings of the permanent resist film were not observed at all was defined as "3", a laminated substrate for evaluation in which cracks and peelings were observed at 2 parts or less out of 10 parts was defined as "2", and the laminated substrate for evaluation in which cracks and peelings were observed at 3 parts or more out of 10 parts was defined as "1". The results were shown in Tables 4 to 6.

TABLE 4

| Evaluation item | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Coating film property | 3 | 3 | 3 | 3 | 3 | 3 | 3 | 3 | 3 | 3 | 2 | 3 |
| Resolution | 3 | 3 | 3 | 3 | 3 | 3 | 3 | 3 | 3 | 3 | 3 | 3 |
| Gold plating resistance | 3 | 3 | 3 | 3 | 3 | 3 | 3 | 3 | 3 | 2 | 3 | 3 |
| Tg | 3 | 3 | 3 | 3 | 3 | 3 | 3 | 3 | 3 | 3 | 3 | 3 |
| CTE | 3 | 3 | 3 | 3 | 3 | 2 | 2 | 3 | 4 | 2 | 4 | 2 |
| HAST RESISTANCE | 3 | 3 | 3 | 3 | 3 | 3 | 3 | 3 | 3 | 2 | 3 | 3 |
| Crack resistance | 3 | 3 | 3 | 3 | 3 | 3 | 3 | 3 | 3 | 3 | 3 | 3 |

TABLE 5

| Evaluation item | Comparative Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Coating film property | 2 | 2 | 2 | 2 | 2 | 3 | 3 | 3 | 3 | 3 | 2 | 3 |
| Resolution | 3 | 3 | 3 | 3 | 3 | 3 | 3 | 3 | 2 | 1 | 1 | 1 |
| Gold plating resistance | 3 | 3 | 3 | 3 | 2 | 3 | 3 | 3 | 3 | 2 | 2 | 1 |
| Tg | 2 | 2 | 2 | 2 | 2 | 3 | 3 | 2 | 2 | 2 | 2 | 2 |
| CTE | 3 | 1 | 1 | 1 | 2 | 2 | 1 | 1 | 2 | 2 | 2 | 2 |
| HAST RESISTANCE | 2 | 2 | 1 | 2 | 1 | 2 | 3 | 3 | 1 | 1 | 1 | 1 |
| Crack resistance | 1 | 1 | 1 | 2 | 2 | 1 | 2 | 2 | 2 | 2 | 1 | 1 |

TABLE 6

| Evaluation item | Example | | | | Comparative Example | | |
|---|---|---|---|---|---|---|---|
| | 13 | 14 | 15 | 16 | 13 | 14 | 15 |
| Coating film property | 3 | 3 | 3 | 3 | 3 | 3 | 3 |
| Resolution | 3 | 3 | 3 | 3 | 3 | 2 | 1 |
| Gold plating resistance | 3 | 2 | 3 | 3 | 2 | 2 | 1 |
| Tg | 3 | 3 | 3 | 2 | 2 | 2 | 3 |
| CTE | 3 | 3 | 2 | 2 | 1 | 1 | 3 |
| HAST RESISTANCE | 3 | 3 | 3 | 2 | 2 | 1 | 2 |
| Crack resistance | 3 | 3 | 3 | 3 | 3 | 3 | 3 |

INDUSTRIAL APPLICABILITY

According to the present invention, a photosensitive resin composition for an alkaline developable solder resist that has a low CTE and a high Tg and is excellent in crack resistance in a highly multi-layered substrate and HAST resistance of an ultrafine pitch and a photosensitive film using the photosensitive resin composition can be provided.

REFERENCE SIGNS LIST

10 Semiconductor package
20 Flip chip type semiconductor package

50 Substrate for mounting semiconductor chip
80 Copper wiring
90 Permanent resist layer
100a, b Insulating substrate
110 Wiring terminal for wire bonding
111 Connection terminal for solder connection
112 Opening
114 Solder ball
115 Gold wiring
116 Sealing resin for semiconductor
117 Adhesive
118 Underfill agent
120 Semiconductor chip.

The invention claimed is:

1. A photosensitive resin composition comprising:
(a) an epoxy resin modified so as to be an acid obtained by adding a polybasic acid anhydride to a product obtained by esterifying an epoxy resin with an ethylenically unsaturated group-containing monocarboxylic acid;
(b) a photopolymerizable monomer having an ethylenically unsaturated group;
(c) a photopolymerization initiator;
(d) an epoxy resin; and
(e) an inorganic filler,
wherein the (a) epoxy resin modified so as to be an acid comprises a bisphenol novolak epoxy resin modified so as to be an acid, and further the photosensitive resin composition satisfies at least one of the conditions shown in the following (I) and (II):
(I) the photopolymerizable monomer comprises a photopolymerizable monomer having a tricyclodecane structure and a urethane bond; and
(II) the inorganic filler comprises a silica filler having a maximum particle size of 1 μm or less in an amount of more than 60 parts by mass based on a total of 100 parts by mass of the epoxy resin modified so as to be an acid and the photopolymerizable monomer.

2. The photosensitive resin composition according to claim 1, wherein the bisphenol novolak epoxy resin modified so as to be an acid, comprises a bisphenol novolak epoxy resin modified so as to be an acid, obtained by adding a polybasic acid anhydride to a product obtained by esterifying an epoxy resin having a structure represented by the following formula (1) with an ethylenically unsaturated group-containing monocarboxylic acid,

(1)

wherein $R^1$ represents a hydrogen atom or a glycidyl group, $R^2$ represents a hydrogen atom or a methyl group, and n represents 1 or more; in addition, a plurality of $R^1$ and $R^2$ may be the same as or different from each other.

3. The photosensitive resin composition according to claim 1, wherein the photopolymerizable monomer having a tricyclodecane structure and a urethane bond comprises a photopolymerizable monomer having a partial structure represented by the following formula (2) or the following formula (3), (2)

(3)

wherein $R^3$, $R^4$, $R^5$, and $R^6$ represent a direct bond, an alkylene group, or an arylene group.

4. The photosensitive resin composition according to claim 1, wherein the photopolymerizable monomer comprises a urethane compound obtained by reacting a diol compound having a tricyclodecane structure, a diisocyanate compound, and a compound having an ethylenically unsaturated group and a hydroxyl group.

5. The photosensitive resin composition according to claim 1, further comprising a curing accelerator having an amino group in the molecule.

6. A photosensitive film comprising:
a support; and
a photosensitive layer formed on the support, the photosensitive layer comprising the photosensitive resin composition according to claim 5.

7. A method for producing a permanent resist comprising:
a step of forming a photosensitive layer comprising the photosensitive resin composition according to claim 5 on the substrate;
a step of irradiating the photosensitive layer with an active ray in a pattern; and
a step of developing the photosensitive layer to form a permanent resist.

8. A permanent resist comprising a cured product of the photosensitive resin composition according to claim 5.

9. A photosensitive film comprising:
a support; and
a photosensitive layer formed on the support, the photosensitive layer comprising the photosensitive resin composition according to claim 1.

10. A method for producing a permanent resist comprising:
a step of forming a photosensitive layer comprising the photosensitive resin composition according to claim 1 on a substrate;
a step of irradiating the photosensitive layer with an active ray in a pattern; and
a step of developing the photosensitive layer to form a permanent resist.

11. A permanent resist comprising a cured product of the photosensitive resin composition according to claim 1.

12. The photosensitive resin composition according to claim 1, wherein the epoxy resin modified so as to be an acid has an acid value of 20 to 180 mg KOH/g.

13. The photosensitive resin composition according to claim 12, wherein said acid value is 50 to 90 mg KOH/g.

14. The photosensitive resin composition according to claim 1, wherein a weight average molecular weight of the epoxy resin modified so as to be an acid is 2000 to 30000.

15. The photosensitive resin composition according to claim 1, wherein the silica filler has an average particle size of 3 to 300 nm.

* * * * *